United States Patent
Kim

(10) Patent No.: US 7,056,814 B2
(45) Date of Patent: Jun. 6, 2006

(54) METHODS OF MANUFACTURING A MOS TRANSISTOR

(75) Inventor: Hak-Dong Kim, Suwon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/025,417

(22) Filed: Dec. 22, 2004

(65) Prior Publication Data

US 2005/0142782 A1  Jun. 30, 2005

(30) Foreign Application Priority Data

Dec. 24, 2003  (KR)  ...................... 10-2003-0096999

(51) Int. Cl.
*H01L 21/425* (2006.01)

(52) U.S. Cl. ...................... 438/514; 438/306; 438/510; 438/527

(58) Field of Classification Search ................ 438/301, 438/306, 307, 510, 514, 517, 527
See application file for complete search history.

(56) References Cited

U.S. PATENT DOCUMENTS 5,731,239 A * 3/1998 Wong et al. ................ 438/296
6,153,456 A * 11/2000 Lin et al. ..................... 438/232
6,582,995 B1 * 6/2003 Hsieh et al. ................. 438/143
6,784,098 B1 * 8/2004 Lou ............................ 438/645

FOREIGN PATENT DOCUMENTS

KR  1998-041851  8/1998

* cited by examiner

*Primary Examiner*—Hoai Pham
*Assistant Examiner*—Khanh Duong
(74) *Attorney, Agent, or Firm*—Andrew D. Fortney

(57) ABSTRACT

Methods of manufacturing MOS transistors which are capable of suppressing a short channel effect are disclosed. The short channel effect is suppressed by forming source/drain regions of a shallow junction and sufficiently doping a gate. An illustrated method includes: forming a gate insulating layer and a gate on a semiconductor substrate of a first conductivity type; forming lightly doped drain regions of a second conductivity type within the substrate at opposite sides of the gate; forming spacers on side walls of the gate; forming an insulating buffer layer; exposing a top surface of the gate by performing a planarization process on the insulating buffer layer; doping the gate by implanting impurity ions of the second conductivity type into the top surface of the gate; removing the insulating buffer layer; and forming source/drain regions of the second conductivity type within the substrate at opposite sides of the spacers.

16 Claims, 5 Drawing Sheets

METHODS OF MANUFACTURING A MOS TRANSISTOR

FIELD OF THE DISCLOSURE

The present disclosure relates generally to semiconductor fabrication, and, more particularly, to methods of manufacturing a MOS transistor.

BACKGROUND

Recently, technologies for manufacturing MOS (Metal Oxide Semiconductor) devices have rapidly developed, so that small-sized, high-performance MOS devices can be obtained. In order to achieve such small-sized, high-performance MOS devices, the technologies relating to the thickness of the gate oxide layer, the source/drain regions, and the channel region must be improved.

Because MOS transistors are highly integrated, a short channel effect (SCE) occurs. In order to suppress the short channel effect, the thickness of the gate oxide layer must be small. In addition, the source/drain regions must be formed with shallow junctions to reduce a charge sharing effect. In addition, in order to suppress the short channel effect of the MOS transistor, a retrograde ion implanting process or a halo ion implanting process may be performed to change the doping profile of the channel.

A prior art method of manufacturing a conventional MOS transistor will now be described with reference to FIGS. 1A to 1D. Referring to FIG. 1A, an active region where a MOS transistor is to be formed is defined by forming isolation layers 110 in an n-type semiconductor substrate 100. (Alternatively, instead of the n-type semiconductor substrate 100, a p-type semiconductor substrate may be used. In such an approach, an n-type well region is formed in the p-type semiconductor substrate). Next, a gate insulating layer 120 and a gate 130 are sequentially formed on the active region of the substrate 100. The active region under the gate 130 serves as a channel region.

Referring to FIG. 1B, a first ion implanting process is performed to form lightly doped drain (LDD) regions 141a, 141b within the substrate 100 on opposite sides of the gate 130. The first implanting process is performed by implanting p-type impurity ions of low concentration 141 (e.g., boron (B) or $BF_2$ ions) in the vertical direction with respect to the substrate 100. Although not shown in the figure, an ion implanting buffer layer may be formed on a surface of the substrate 100 prior to performing the first ion implanting process.

Referring to FIG. 1C, in order to reduce the short channel effect, a second ion implanting process is performed to form halo regions 142a, 142b in contact with the LDD regions 141a, 141b within the substrate 100. The halo regions 142a, 142b are formed inwardly of the LDD regions 141a, 141b by implanting n-type impurity ions 142 (e.g., arsenic (As) ions) in a tilted direction with respect to the substrate 100.

Referring to FIG. 1D, spacers 150 are formed on opposite side walls of the gate 130. In the illustrated process, the spacers 150 comprise a nitride layer or a double-stacked layer comprising an oxide layer and a nitride layer. Next, a third ion implanting process is performed to form source/drain regions 143a, 143b within the substrate 100 on opposite sides of the spacers 150. The third ion implanting process is performed by implanting p-type impurity ions at a high concentration 143 (e.g., B ions) in a vertical direction with respect to the substrate 100. As shown in FIG. 1D, the source/drain regions 143a, 143b are formed to a deeper level than the LDD regions 141a, 141b. The p-type impurity ions 143 are also implanted into the gate 130 to dope the gate 130.

In the conventional method of manufacturing the MOS transistor described above, in order to suppress the occurrence of the short channel effect due to the high integration density, the source/drain regions 143a, 143b must be formed with the shallow junction. For this reason, a low ion implanting energy is used during the third ion implanting process. However, if the ion implanting energy is low, the gate 130 is not sufficiently doped and, thus, depletion of the gate increases. In addition, the p-type impurity ions 143 implanted into the gate 130 may penetrate into the channel region during the subsequent thermal treatment process. This penetration may deteriorate electrical properties such as threshold voltages and channel currents of the MOS transistor.

DETAILED DESCRIPTION

Figure 1A:
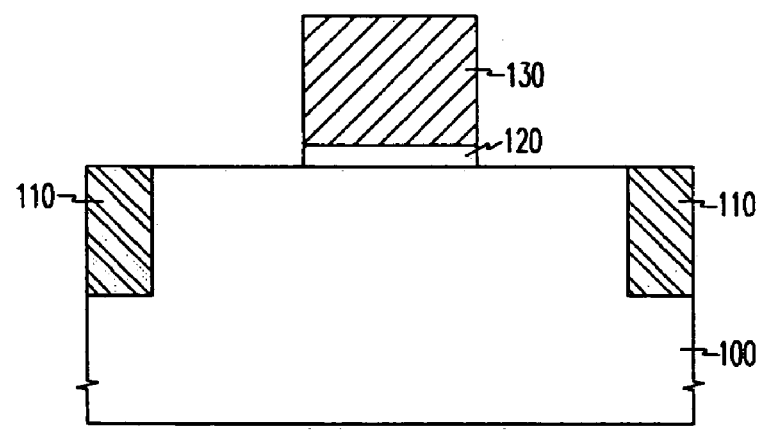
FIGS. 1A to 1D are cross sectional views illustrating a prior art method of manufacturing a conventional MOS transistor.
Figure 1B:
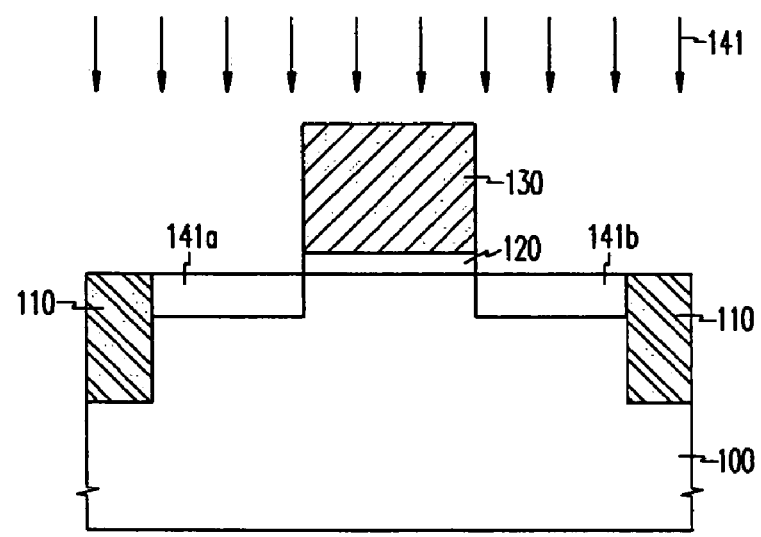
Figure 1C:
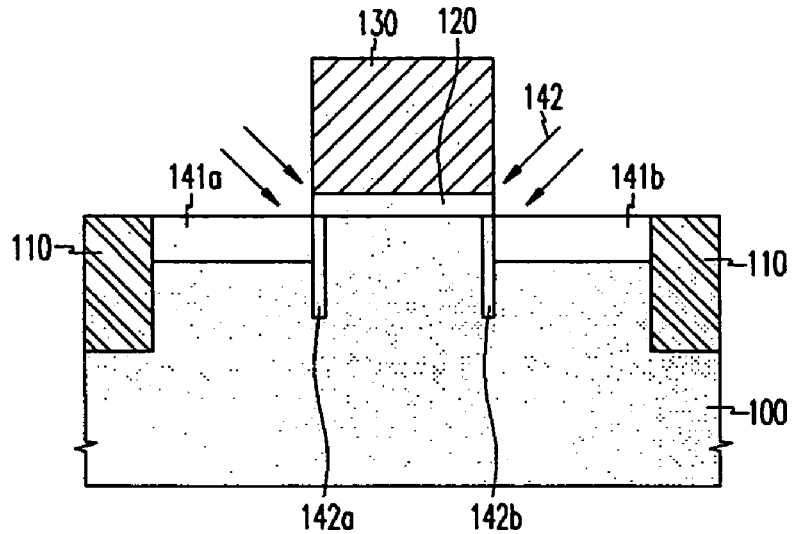
Figure 1D:
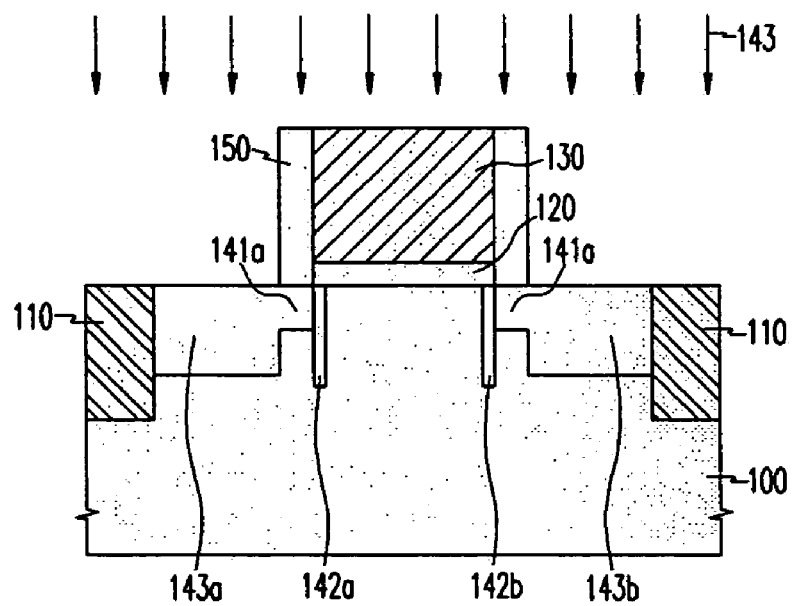
Figure 2A:
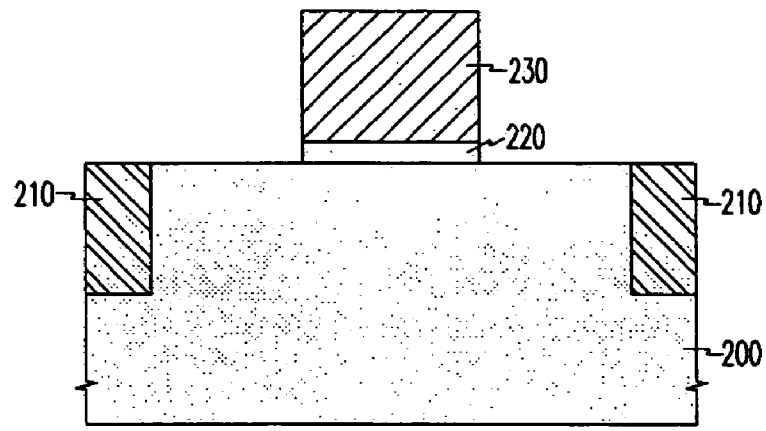
FIGS. 2A to 2F are cross sectional views illustrating an example method of manufacturing a MOS transistor performed in accordance with the teachings of the present invention.

FIGS. 2A to 2F are cross sectional views illustrating an example method of manufacturing a MOS transistor performed in accordance with the teachings of the present invention. Referring to FIG. 2A, an active region is defined by forming isolation layers 210 in an n-type semiconductor substrate 200. (Instead of the n-type semiconductor substrate 200, a p-type semiconductor substrate may be used. In such a case, an n-type well region is formed in the p-type semiconductor substrate). The isolation layers 210 are formed by a shallow trench isolation (STI) process.

Next, a gate insulating layer 220 and a gate 230 are sequentially formed on the active region of the substrate 200. The active region under the gate 230 serves as a channel region. In the illustrated example, the gate insulating layer 220 is an oxide layer; and the gate conductive layer 230 is a polysilicon layer.

Figure 2B:
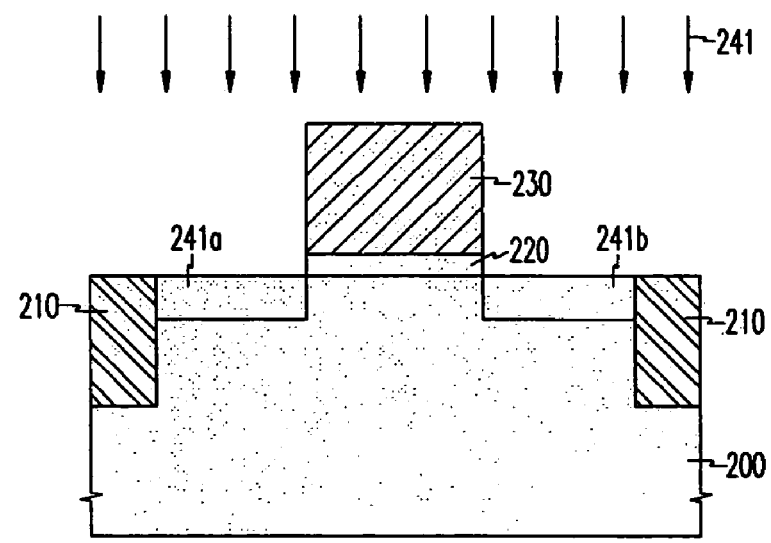

Referring to FIG. 2B, a first ion implanting process is performed to form lightly doped drain (LDD) regions 241a, 241b within the substrate 200 at opposite sides of the gate 230. The first ion implanting process is performed by implanting p-type impurity ions of low concentration 241 (e.g., boron (B) or $BF_2$ ions) in a substantially vertical direction with respect to the substrate 200. Preferably, the first ion implanting process is performed at an implanting energy of about 5 to 30 keV and a concentration of about $1 \times 10^{15}$ to $5 \times 10^{15}$ ions/$cm^2$ using $BF_2$ ions. In addition, although not shown in the figure, an oxide layer having a thickness of about 60 Å may be formed on the surface of the substrate 200 as an ion implanting buffer layer prior to performing the first ion implanting process.

Figure 2C:
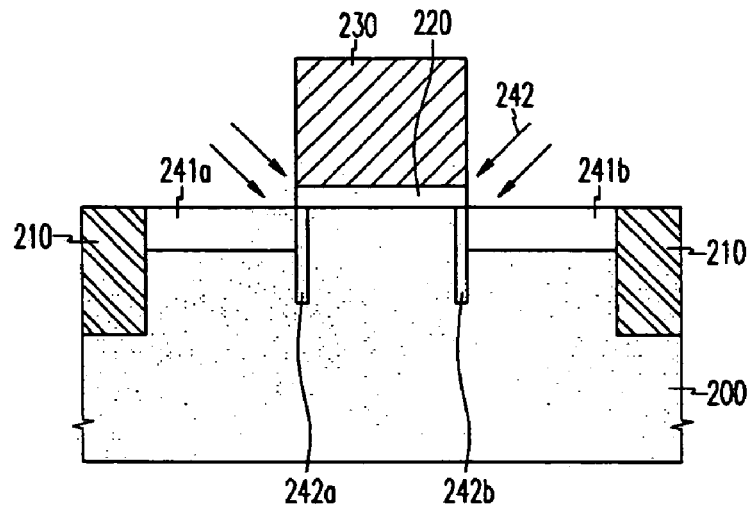

Referring to FIG. 2C, in order to reduce a short channel effect, a second ion implanting process is performed to form halo regions 242a, 242b within the substrate 200 in contact with the LDD regions 241a, 241b. The halo regions 242a, 242b are formed inwardly of the LDD regions 241a, 241b by implanting n-type impurity ions 242 (e.g., arsenic (As) ions) in a tilted direction with respect to the substrate 200.

Preferably, the second ion implanting process is performed at an implanting energy of about 10 to 70 keV and a concentration of about $1\times10^{14}$ to $1\times10^{15}$ ions/cm$^2$ using arsenic (As) ions. The tilt angle is controlled to 20 to 30 degrees.

Next, the impurity ions implanted within the substrate 200 are activated by performing a thermal treatment process. Preferably, the thermal treatment process is performed at a temperature of about 700 to 1050° C. in N$_2$ ambience for 5 to 30 seconds using a rapid thermal process (RTP).

Figure 2D:
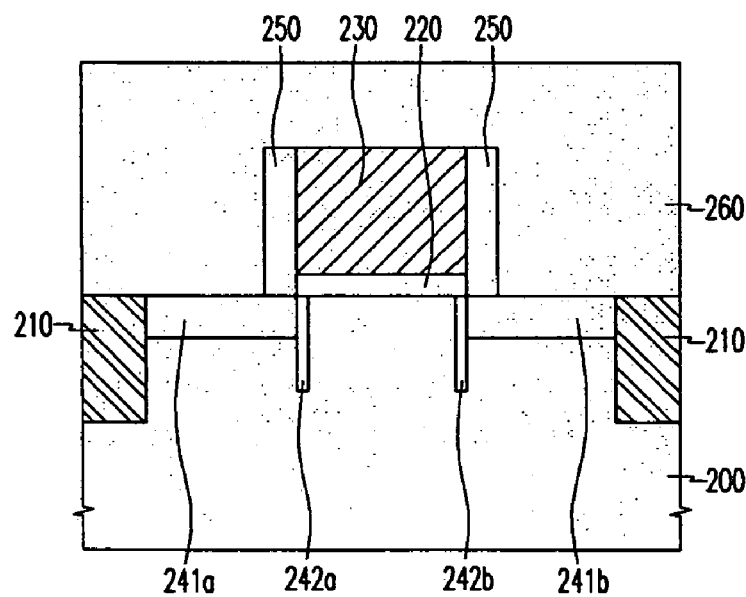

Referring to FIG. 2D, spacers 250 are formed on opposite side walls of the gate 230. In the illustrated example, the spacers 250 are implemented by a nitride layer or by a double-stacked layer comprising an oxide layer and a nitride layer. If the spacer 250 is implemented by the double-stacked layer, a TEOS (tetra ethoxy silane) layer having a thickness of about 100 to 300 Å is used as the oxide layer and a silicon nitride (Si$_3$N$_4$) layer having a thickness of about 700 to 800 Å is used as the nitride layer. Next, an insulating buffer layer 260 is formed on the entire surface of the substrate 200 as shown in FIG. 2D. In the illustrated example, the insulating buffer layer 260 is formed of a TEOS oxide layer having a thickness of about 2000 to 5000 Å or a low temperature oxide (LTO) layer having a thickness of about 50 Å and a boron phosphorus silicate glass (BPSG) layer having a thickness of about 2000 to 5000 Å.

Figure 2E:
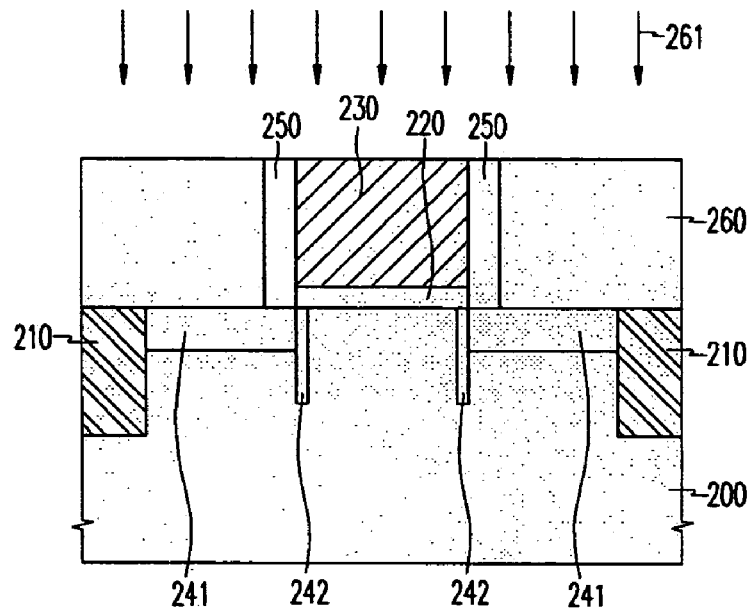

Referring to FIG. 2E, a top surface of the gate 230 is exposed by performing a planarization process such as a CMP (chemical mechanical polishing) process or an etch-back process on the insulating buffer layer 260. In example employing a CMP process as the planarization process, the insulating buffer layer 260 is preferably a TEOS layer. In examples employing an etch-back process as the planarization process, the insulating buffer layer 260 is preferably an LTO layer and a BPSG layer. In addition, examples employing the etch-back process, a low temperature flow process must be performed to planarize the BPSG layer prior to the etch-back process.

After the planarization process is performed, a third ion implanting process is performed to dope the gate 230. The gate 230 is doped by implanting p-type impurity ions 261 (e.g., B ions) in a substantially vertical direction with respect to the substrate 200. Preferably, the third ion implanting process is performed at an implanting energy of about 5 to 50 keV and a concentration of about $1\times10^{14}$ to $5\times10^{15}$ ions/cm$^2$ using B ions.

Figure 2F:
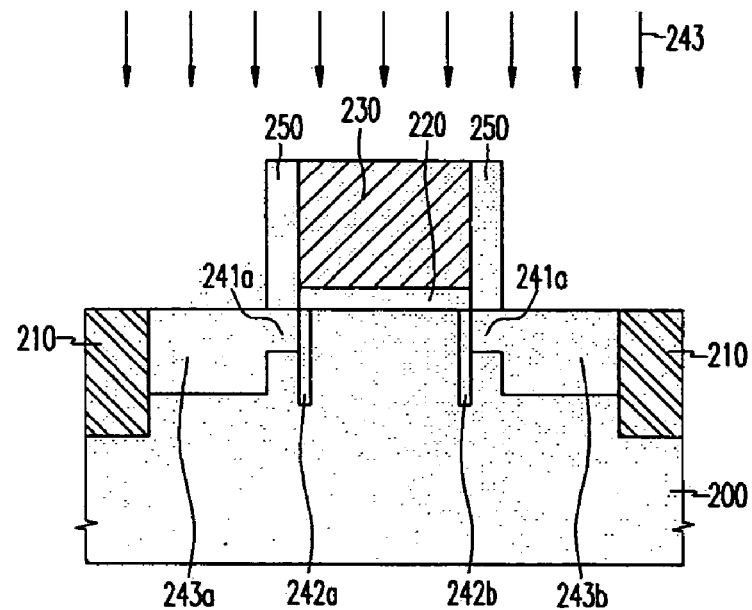

Referring to FIG. 2F, the insulating buffer layer 260 (see FIG. 2E) is removed. Then, a fourth ion implanting process is performed to form source/drain regions 243a, 243b within the substrate 200 on opposite sides of the spacers 250. The fourth ion implanting process is performed by implanting p-type impurity ions (e.g., B ions) at a high concentration 243 in a substantially vertical direction with respect to the substrate 200. Preferably, the fourth ion implanting process is performed at an implanting energy of about 5 to 50 keV and a concentration of about $1\times10^{15}$ to $5\times10^{15}$ ions/cm$^2$ using B ions. In the illustrated example, the source/drain regions 243a, 243b are formed to a deeper level than the LDD regions 241a, 241b.

Next, the impurity ions implanted within the substrate 200 are activated by performing a thermal treatment process. Preferably, the thermal treatment process is performed at a temperature of about 700 to 1050° C. in an N$_2$ ambience for about 5 to 30 seconds by a RTP.

Next, although not shown in the figure, the MOS transistor is completed by performing known conventional processes such as a silicide process and a metal interconnection line process.

In the examples described above, the gate 230 is sufficiently doped by implanting impurity ions into the gate 230 while using the insulating buffer layer 260 which exposes the top surface of the gate 230 to mask other areas of the device. As a result, depletion of the gate cannot increase, and the impurities cannot penetrate into a channel region during the subsequent thermal treatment process.

In addition, the ion implanting energy of the fourth ion implanting process for forming the source/drain regions 243a, 243b can be easily lowered, so that the source/drain regions 243a, 243b can be formed as a shallow junction. Therefore, it is possible to suppress the short channel effect.

In addition, after doping of the gate 230, the impurity ions implanted in the gate 230 can be maximally activated, so that it is possible to reduce resistance of the gate 230.

As a result, it is possible to improve electrical properties such as threshold voltages and channel currents of the MOS transistor.

From the foregoing, persons of ordinary skill in the art will readily appreciate that, although only the p-channel MOS transistor is described in the above examples, the disclosed methods can be easily adapted to an n-channel MOS transistor and/or to a CMOS transistor, where p-type and n-channel MOS transistors are formed in a single substrate.

In case of an n-channel MOS transistor, the first ion implanting process for forming the LDD regions is performed at an implanting energy of about 10 to 70 keV and a concentration of about $1\times10^{15}$ to $5\times10^{15}$ ions/cm$^2$ using n-type impurity ions (e.g., As ions) of low concentration. Additionally, the second ion implanting process for forming the halo regions is performed at an implanting energy of about 5 to 50 keV and a concentration of about $1\times10^{14}$ to $1\times10^{15}$ ions/cm$^2$ using p-type impurity ions (e.g., B ions). The tilt angle of the second ion implanting process is controlled to about 20 to 30 degrees. Further, the third ion implanting process for doping the gate is performed at an implanting energy of about 10 to 70 keV and a concentration of about $1\times10^{14}$ to $5\times10^{15}$ ions/cm$^2$ using n-type impurity ions (e.g., phosphorus (P) ions). Moreover, the fourth ion implanting process for forming source/drain regions is performed at an implanting energy of about 10 to 80 keV and a concentration of about $1\times10^{15}$ to $5\times10^{15}$ ions/cm$^2$ using n-type impurity ions (e.g., As ions) at a high concentration.

From the foregoing, persons of ordinary skill in the art will readily appreciate that methods of manufacturing MOS transistors which are capable of suppressing the short channel effect are disclosed. The short channel effect is suppressed by forming source/drain regions of a shallow junction and sufficiently doping a gate.

A disclosed example method of manufacturing a MOS transistor comprises: sequentially forming a gate insulating layer and a gate on a semiconductor substrate of a first conductivity type; forming lightly doped drain regions of a second conductivity type within the substrate at opposite sides of the gate; forming spacers on side walls of the gate; forming an insulating buffer layer on the entire surface of the substrate; exposing a top surface of the gate by performing a planarization process on the insulating buffer layer; doping the gate by implanting impurity ions of the second conductivity type into the top surface of the gate; removing the insulating buffer layer; and forming source/drain regions of the second conductivity type within the substrate at opposite sides of the spacers.

It is noted that this patent claims priority from Korean Patent Application Serial Number 10-2003-0096999, which was filed on Dec. 24, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a MOS transistor comprising:
    forming a gate insulating layer and a gate on a semiconductor substrate of a first conductivity type;
    forming lightly doped drain regions of a second conductivity type within the substrate on opposite sides of the gate;
    forming spacers on side walls of the gate;
    forming an insulating buffer layer;
    exposing a top surface of the gate by performing a planarization process on the insulating buffer layer;
    doping the gate by implanting impurity ions of the second conductivity type into the top surface of the gate;
    removing the insulating buffer layer; and
    forming source/drain regions of the second conductivity type within the substrate on opposite sides of the spacers.

2. A method as defined in claim 1, wherein the insulating buffer layer comprises a TEOS (tetra ethoxy silane) layer.

3. A method as defined in claim 2, wherein the planarization process is a CMP process.

4. A method as defined in claim 1, wherein the insulating buffer layer is formed by stacking a low temperature oxide (LTO) layer and a BPSG (boron phosphorus silicate glass) layer.

5. A method as defined in claim 4, wherein the planarization process is an etch-back process.

6. A method as defined in claim 1 further comprising forming halo regions in contact with the lightly doped drain regions within the substrate.

7. A method as defined in claim 6 wherein the halo regions are located inwardly from the lightly doped drain regions, and the halo regions are formed after forming the lightly doped drain regions and before forming the spacers.

8. A method as defined in claim 6, wherein forming the halo regions comprises implanting impurity ions in a tilted direction with respect to the substrate.

9. A method as defined in claim 1 further comprising performing a thermal treatment process after forming the lightly doped drain regions and before forming the spacers.

10. A method as defined in claim 9, wherein the thermal treatment process is performed at a temperature of about 700 to 1050° C. in an $N_2$ ambience for about 5 to 30 seconds by an RTP.

11. A method as defined in claim 1 further comprising performing a thermal treatment process after forming the source/drain regions.

12. A method as defined in claim 11, wherein the thermal treatment process is performed at a temperature of about 700 to 1050° C. in an $N_2$ ambience for about 5 to 30 seconds by an RTP.

13. A method as defined in claim 1, wherein the first conductivity type is an n-type and the second conductivity type is a p-type.

14. A method as defined in claim 13, wherein the source/drain regions are formed by performing ion implanting at an implanting energy of about 5 to 50 keV at a concentration of about $1 \times 10^{15}$ to $5 \times 10^{15}$ ions/cm$^2$ using boron (B) ions.

15. A method as defined in claim 1, the first conductivity type is a p-type and the second conductivity type is an n-type.

16. A method as defined in claim 15, wherein the source/drain regions are formed by performing ion implanting at an implanting energy of about 10 to 80 keV at a concentration of about $1 \times 10^{15}$ to $5 \times 10^{15}$ ions/cm$^2$ using arsenic (As) ions.

* * * * *